(12) United States Patent
Aderhold et al.

(10) Patent No.: US 9,728,471 B2
(45) Date of Patent: *Aug. 8, 2017

(54) SYSTEM FOR NON RADIAL TEMPERATURE CONTROL FOR ROTATING SUBSTRATES

(71) Applicant: Applied Materials, Inc., Santa Clara, CA (US)

(72) Inventors: Wolfgang R. Aderhold, Cupertino, CA (US); Aaron Hunter, Santa Cruz, CA (US); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 567 days.

This patent is subject to a terminal disclaimer.

(21) Appl. No.: 14/247,816

(22) Filed: Apr. 8, 2014

(65) Prior Publication Data

US 2014/0220710 A1    Aug. 7, 2014

Related U.S. Application Data

(60) Continuation of application No. 13/548,858, filed on Jul. 13, 2012, now Pat. No. 8,724,977, which is a
(Continued)

(51) Int. Cl.
*A21B 2/00* (2006.01)
*F26B 19/00* (2006.01)
(Continued)

(52) U.S. Cl.
CPC ............ *H01L 22/26* (2013.01); *H01L 21/324* (2013.01); *H01L 21/67115* (2013.01); *H01L 21/67248* (2013.01); *H01L 22/10* (2013.01)

(58) Field of Classification Search
None
See application file for complete search history.

(56) References Cited

U.S. PATENT DOCUMENTS 5,741,070 A    4/1998    Moslehi
5,743,643 A    4/1998    Gronet et al.
(Continued)

FOREIGN PATENT DOCUMENTS

CN    1922457 A    2/2007
CN    1973356 A    5/2007
(Continued)

OTHER PUBLICATIONS

Taiwan Office Action (with attached English translation of the Search Report) for Application No. 102100272 dated Nov. 26, 2014; 7 total pages.
(Continued)

*Primary Examiner* — Thor Campbell
(74) *Attorney, Agent, or Firm* — Patterson + Sheridan, LLP

(57) ABSTRACT

Embodiments of the present invention provide apparatus and method for reducing non uniformity during thermal processing. One embodiment provides an apparatus for processing a substrate comprising a chamber body defining a processing volume, a substrate support disposed in the processing volume, wherein the substrate support is configured to rotate the substrate, a sensor assembly configured to measure temperature of the substrate at a plurality of locations, and one or more pulse heating elements configured to provide pulsed energy towards the processing volume.

3 Claims, 20 Drawing Sheets

Related U.S. Application Data division of application No. 12/434,239, filed on May 1, 2009, now Pat. No. 8,249,436.

(60) Provisional application No. 61/055,814, filed on May 23, 2008, provisional application No. 61/050,167, filed on May 2, 2008.

(51) Int. Cl.
*H01L 21/66* (2006.01)
*H01L 21/324* (2006.01)
*H01L 21/67* (2006.01)

(56) References Cited

U.S. PATENT DOCUMENTS

| | | | |
|---|---|---|---|
| 5,755,511 A | 5/1998 | Peuse et al. | |
| 6,005,226 A | 12/1999 | Aschner et al. | |
| 6,079,874 A | 6/2000 | Hegedus | |
| 6,188,044 B1* | 2/2001 | Lee et al. | 219/390 |
| 6,190,040 B1 | 2/2001 | Renken et al. | |
| 6,217,212 B1 | 4/2001 | Brenninger et al. | |
| 6,222,990 B1 | 4/2001 | Guardado et al. | |
| 6,393,210 B1 | 5/2002 | Wu | |
| 6,492,625 B1 | 12/2002 | Boguslavskiy et al. | |
| 6,616,332 B1 | 9/2003 | Renken et al. | |
| 6,753,272 B1* | 6/2004 | Lee et al. | 438/795 |
| 6,770,146 B2 | 8/2004 | Koren et al. | |
| 6,800,833 B2 | 10/2004 | Gregor et al. | |
| 6,803,297 B2 | 10/2004 | Jennings et al. | |
| 6,916,744 B2 | 7/2005 | Achutharaman et al. | |
| 6,927,169 B2 | 8/2005 | Maydan et al. | |
| 6,970,644 B2 | 11/2005 | Koren et al. | |
| 7,026,581 B2 | 4/2006 | Pharand et al. | |
| 7,127,367 B2 | 10/2006 | Ramachandran et al. | |
| 7,269,343 B2* | 9/2007 | Koren et al. | 392/416 |
| 2003/0183612 A1 | 10/2003 | Timans et al. | |
| 2005/0102108 A1 | 5/2005 | Ramachandran et al. | |
| 2005/0191044 A1* | 9/2005 | Aderhold et al. | 392/418 |
| 2006/0018639 A1 | 1/2006 | Ramamurthy et al. | |
| 2006/0051077 A1 | 3/2006 | Kubo | |
| 2006/0066193 A1 | 3/2006 | Ranish et al. | |
| 2006/0086713 A1 | 4/2006 | Hunter et al. | |
| 2006/0228818 A1 | 10/2006 | Chacin et al. | |
| 2006/0240680 A1 | 10/2006 | Yokota et al. | |
| 2006/0286807 A1* | 12/2006 | Hwang et al. | 438/715 |
| 2007/0291818 A1 | 12/2007 | Yasuda et al. | |
| 2008/0025368 A1* | 1/2008 | Aderhold et al. | 374/102 |
| 2008/0069550 A1 | 3/2008 | Timans et al. | |
| 2008/0090309 A1* | 4/2008 | Ranish et al. | 438/5 |
| 2008/0170842 A1 | 7/2008 | Hunter et al. | |
| 2009/0274454 A1 | 11/2009 | Aderhold et al. | |

FOREIGN PATENT DOCUMENTS

| | | |
|---|---|---|
| JP | 11220007 A | 8/1999 |
| TW | 416112 B | 12/2000 |
| TW | 535231 B | 6/2003 |
| TW | 538480 B | 6/2003 |
| WO | 2004038777 A1 | 5/2004 |
| WO | 2005062346 A1 | 7/2005 |
| WO | 2008016647 A2 | 2/2008 |

OTHER PUBLICATIONS

PCT International Search Report and Written Opinion dated Dec. 23, 2009 for International Application No. PCT/US2009/042538.
Chinese Office Action dated May 15, 2012 regarding Appplication No. 200980115810.9.
Extended European Search Report dated May 16, 2012 for European Patent Application No. 09739939.8.
Communication pursuant to Article 94(3) EPC for European Application No. 09739939.8 dated Apr. 8, 2016.
Office Action for Korean Application No. 10-2010-7026934 dated Sep. 14, 2015.
Office Action from Chinese Patent Application Serial No. 201410183428.4 dated Jun. 29, 2016.
Office Action for Korean Application No. 10-2016-7012831 dated Sep. 1, 2016.
Office Action from Chinese Patent Application Serial No. 2014101834284 dated Jun. 29, 2016.

* cited by examiner

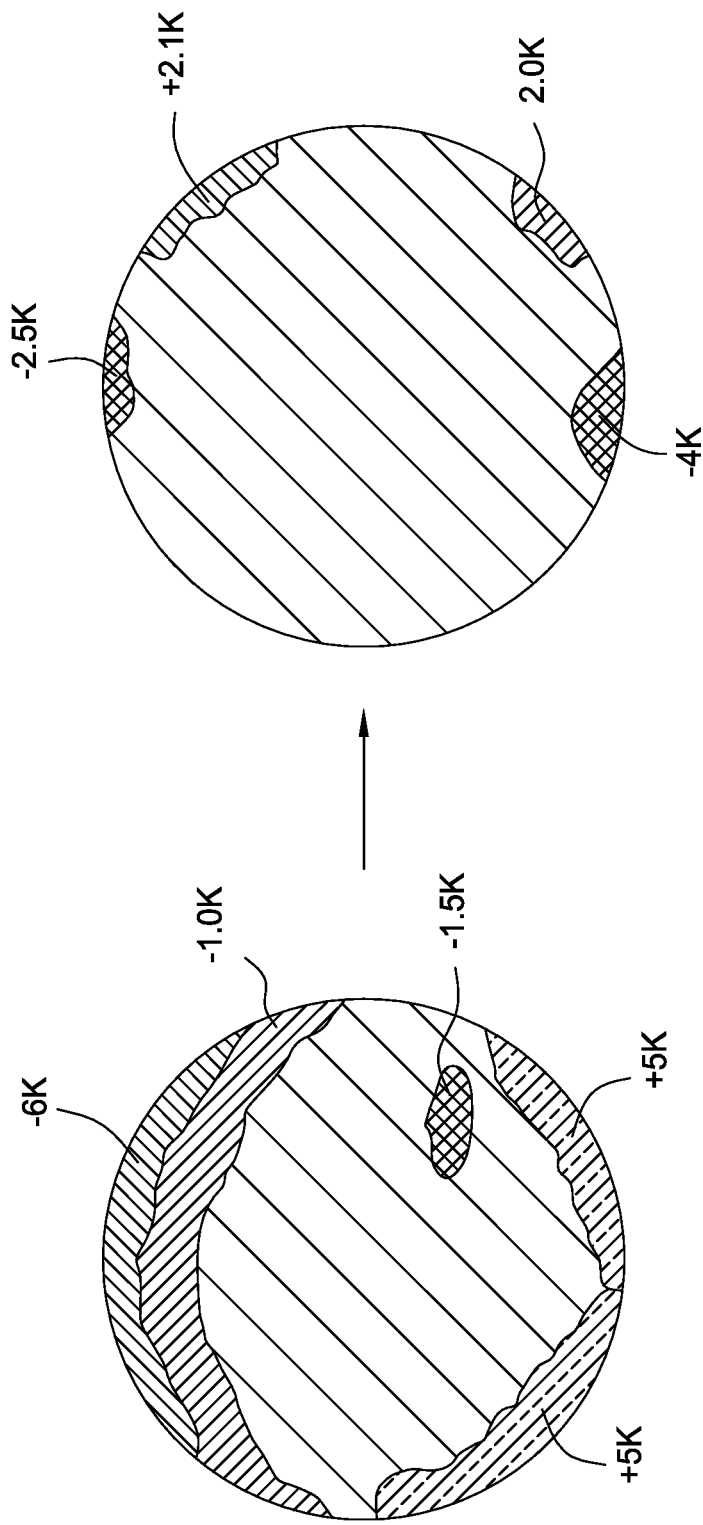

SYSTEM FOR NON RADIAL TEMPERATURE CONTROL FOR ROTATING SUBSTRATES

CROSS-REFERENCE TO RELATED APPLICATIONS

This application is a continuation application of U.S. patent application Ser. No. 13/548,858, filed Jul. 13, 2012, which is a divisional application of U.S. patent application Ser. No. 12/434,239, filed May 1, 2009, now U.S. Pat. No. 8,249,436 B2, issued on Aug. 21, 2012, which claims priority to U.S. Provisional Patent Application Ser. No. 61/050,167, filed May 2, 2008, and U.S. Provisional Patent Application Ser. No. 61/055,814, filed May 23, 2008. Each of the aforementioned patent applications is herein incorporated by reference.

BACKGROUND OF THE INVENTION

Field of the Invention

Embodiments of the present invention generally relate to apparatus and method for processing semiconductor substrates. Particularly, embodiments of the present invention relate to processing a substrate in a rapid thermal processing chamber.

Description of the Related Art

Rapid thermal processing (RTP) is a process for annealing substrates during semiconductor processing. During RTP, a substrate is generally supported by a supporting device near the edge region and rotated as the substrate is heated by one or more heat sources. During RTP, thermal radiation is generally used to rapidly heat a substrate in a controlled environment to a maximum temperature of up to about 1350° C. This maximum temperature is maintained for a specific amount of time ranging from less than one second to several minutes depending on the process. The substrate is then cooled to room temperature for further processing. High intensity tungsten halogen lamps are commonly used as the source of heat radiation. The substrate may be provided additional heat by a heated susceptor conductively coupled to the substrate.

The semiconductor fabrication process has several applications of RTP. Such applications include thermal oxidation, high temperature soak anneal, low temperature soak anneal, and spike anneal. In thermal oxidation, a substrate is heated in oxygen, ozone, or a combination of oxygen and hydrogen which causes silicon substrate to oxidize to form silicon oxide. In high temperature soak anneal, a substrate is exposed to different gas mixtures such as nitrogen, ammonia, or oxygen. Low temperature soak anneal is generally used to anneal substrate deposited with metal. Spike anneal is used when the substrate needs to be exposed to high temperature for a very short time. During a spike anneal, the substrate is rapidly heated to a maximum temperature sufficient to activate dopant and cooled rapidly to end the activation process prior to substantial diffusion of the dopant.

RTP usually requires a substantially uniform temperature profile across the substrate. In the state of the art process, the temperature uniformity may be improved by controlling heat sources, such as a laser, an array of lamps, configured to heat the substrate on the front side while a reflective surface on the back side reflects heat back to the substrate. Emissivity measurement and compensation methodology have been used to improve the temperature gradient across the substrate.

As the semiconductor industry develops, the requirement for temperature uniformity during a RTP also increases. In some processes, it is important to have substantially small temperature gradient from about 2 mm inside the edge of the substrate. Particularly, it may be necessary to heat a substrate at a temperature between about 200° C. to about 1350° C. with a temperature deviation of about 1° C. to 1.5° C. The state of the art RTP systems incorporate radially controllable zones to improve uniformity along a radius of the substrate being processed. However, non-uniformities are caused by variety of reasons and appear in variety of patterns. The non-uniformity is more likely a non-radial non-uniformity, in which temperatures on different locations have the same radius varies. A non-radial non-uniformity cannot be resolved by adjusting heating sources according to their radial locations.

FIGS. 1A-1D schematically illustrates exemplary non-radial non-uniformities. In a RTP system, an edge ring is usually used to support a substrate near the periphery. The edge ring and the substrate overlap producing a complicated heating situation near the edge of the substrate. In one aspect, the substrate may have different thermal properties near the edge. This is mostly pronounced for a patterned substrate, or for a silicon-on isulator—(SOI) substrate. In another aspect, the substrate and the edge ring overlap near the edge, it is difficult to achieve uniform temperature profile near the edge by measuring and adjusting the temperature of the substrate alone. Depending on the edge ring's thermal properties relative to the substrate's thermal and optical properties, the temperature profile of a substrate is generally either edge high or edge low.

FIG. 1A schematically illustrates two types of common temperature profiles of a substrate processed in a RTP chamber. The vertical axis denotes measured temperatures on a substrate. The horizontal axis denotes the distance from the edge of the substrate. Profile 1 is an edge high profile where the edge of the substrate has the highest temperature measurement. Profile 1 is an edge low profile where the edge of the substrate has the lowest temperature measurement. It is difficult to remove temperature deviation near the edge of the substrate in the state of the art RTP systems.

FIG. 1A is a schematic top view of a substrate 102 disposed on supporting ring 101. The supporting ring 101 rotates about a center, which generally coincides with a center of the whole system. It is desired that a center of the substrate 102 is aligned with the center of the supporting ring 101. However, the substrate 102 is likely to misaligned with the supporting ring 101 during to different reasons. As the requirements for thermal processing increase, a small misalignment between the substrate 102 and the supporting ring 101 may cause non-uniformity as shown in FIG. 1B. During a spike process, a misplacement of 1 mm may cause temperature variation of about 30° C. The state of the art thermal processing systems have a substrate placement accuracy of about 0.18 mm, thus have a temperature variation of about 5° C. due to alignment limitation.

FIG. 1B is a schematic temperature map of the substrate 102 during thermal processing where the substrate 102 is misaligned with the supporting ring 101. The substrate 102 generally has both a high temperature zone 103 and a low temperature zone 104 along an edge region 105.

FIG. 1C is a schematic temperature map of a substrate 107 during rapid thermal processing. The substrate 107 has a temperature gradient along a horizontal direction 106. The temperature gradient of FIG. 1C may be caused by various reasons, such as ion implantation, chamber asymmetry, intrinsic substrate properties, and process kit variability.

FIG. 1D is a schematic temperature map of a patterned substrate 108 which has surface structures 109 formed from materials different than the substrate 108. Line 111 is a temperature profile across a diameter of the substrate 108. The temperature varies because the properties of the surface structures 109 are different from the substrate 108. Since most substrates in thermal processing have structures formed thereon, temperature variation caused by local pattern is a common phenomena.

Therefore, there is a need for apparatus and methods used in RTP for reducing non-radial temperature non-uniformity.

SUMMARY OF THE INVENTION

Embodiments of the present invention provide apparatus and method for reducing non-uniformity during thermal processing. Particularly, embodiments of the present invention provide apparatus and method for reducing non-radial non uniformity during thermal processing.

One embodiment of the present invention provides an apparatus for processing a substrate comprising a chamber body defining a processing volume, a substrate support disposed in the processing volume, wherein the substrate support is configured to rotate the substrate, a sensor assembly configured to measure temperature of the substrate at a plurality of locations, and one or more pulse heating elements configured to provide pulsed energy towards the processing volume.

Another embodiment of the present invention provides a method for processing a substrate comprising placing a substrate on a substrate support disposed in a processing volume of a processing chamber, rotating the substratem and heating the substrate by directing radiant energy towards the processing volume, wherein at least a portion of the radiant energy is pulsed energy having a frequency determined by a rotational speed of the substrate.

Yet another embodiment of the present invention provides a thermal processing chamber comprising a chamber body having a processing volume defined by chamber walls, a quartz window, and a reflector plate, wherein the quartz window and the reflector plate are disposed on opposite side of the processing volume, a substrate support disposed in the processing volume, wherein the substrate support is configured to support and rotate a substrate, a heating source disposed outside the quartz window and configured to direct energy towards the processing volume through the quartz window, wherein the heating source comprises a plurality of heating elements, and at least a portion of the heating elements are pulse heating elements configured to provide pulsed energy towards the processing volume, a sensor assembly disposed through the reflector plate and configured to measure temperature along different radius locations in the processing volume, and a system controller configured to adjust one of frequency, phase, and amplitude of the pulsed energy from the heating source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6E-6F schematically illustrate uniformity improvement by adjusting phase and amplitude of a laser heating source.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide apparatus and method for reducing non-uniformity during thermal processing. Particularly, embodiments of the present invention provide apparatus and method for reducing non-radial non uniformity during thermal processing.

One embodiment of the present invention provides a thermal processing chamber having one or more pulse heating elements. One embodiment of the present invention provides a method for reducing non-uniformity by adjusting, at least one of frequency, phase and amplitude of a power source for the one or more pulse heating elements. In one embodiment, adjusting the phase and/or amplitude of the power source is performed at a frequency determined by a rotation frequency of the substrate. In one embodiment, the power source has the same frequency as the rotation of the substrate. In one embodiment, the phase of the power source is determined by a temperature map obtained from a plurality of sensors.

In one embodiment, the thermal processing chamber comprises a plurality of heating elements that are grouped in one or more azimuthally controlled zones. In one embodiment, each of azimuthally controlled zones comprises one or more heating elements that may be controlled by adjusting phase and/or amplitude of a power source.

In another embodiment, the thermal processing chamber comprises one or more auxiliary heating elements in addition to a main heating source. In one embodiment, the one or more auxiliary heating elements may be controlled by adjusting phase and/or amplitude of its power source.

Another embodiment of the present invention provides a thermal processing chamber comprising a heating source configured to heat a back side of a substrate being processed. Heating the substrate from the back side during thermal processing reduces non-uniformity caused by pattern of the substrate.

Figure 1A:
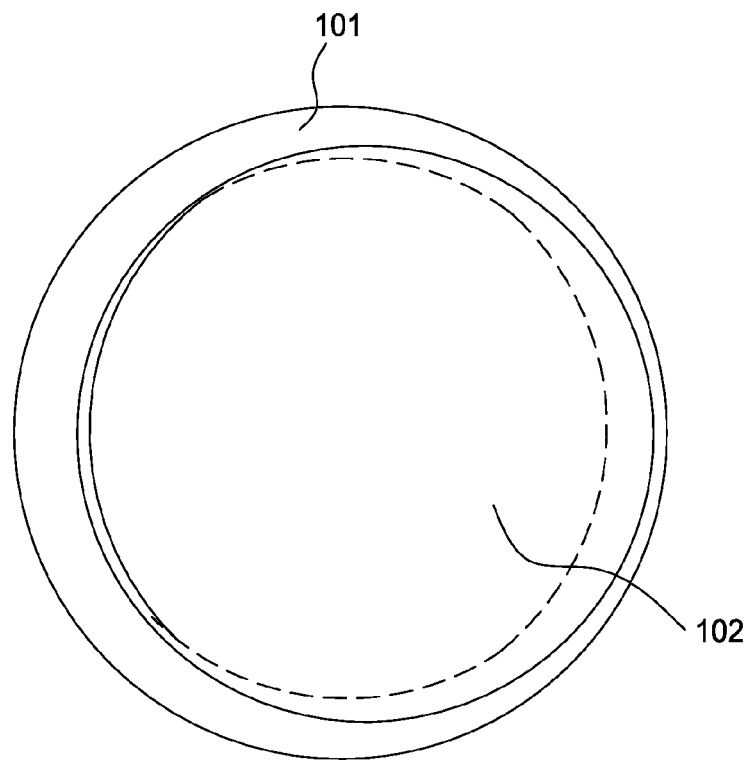
FIG. 1A is a schematic top view of a substrate disposed on a supporting ring during thermal processing.
Figure 1B:
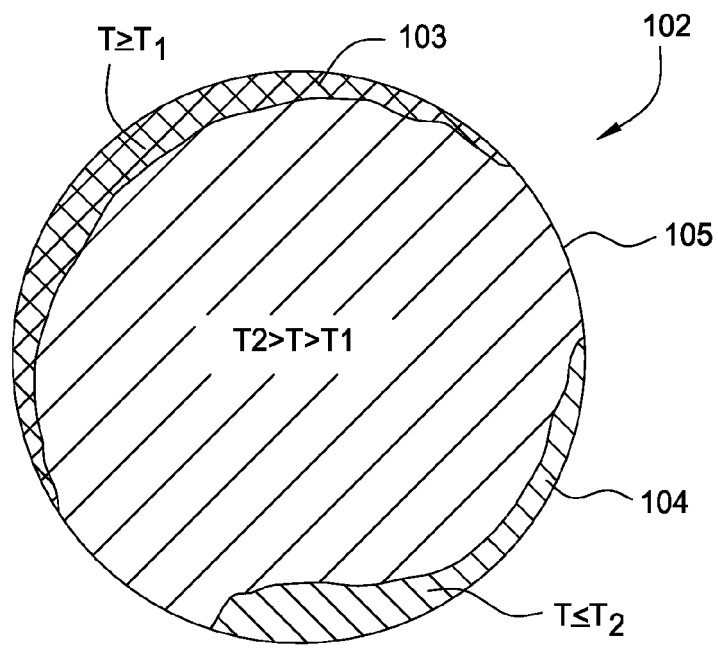
FIG. 1B is a schematic temperature map of a substrate during thermal processing, the temperature map showing non-radial non-uniformity caused by misalignment.
Figure 1C:
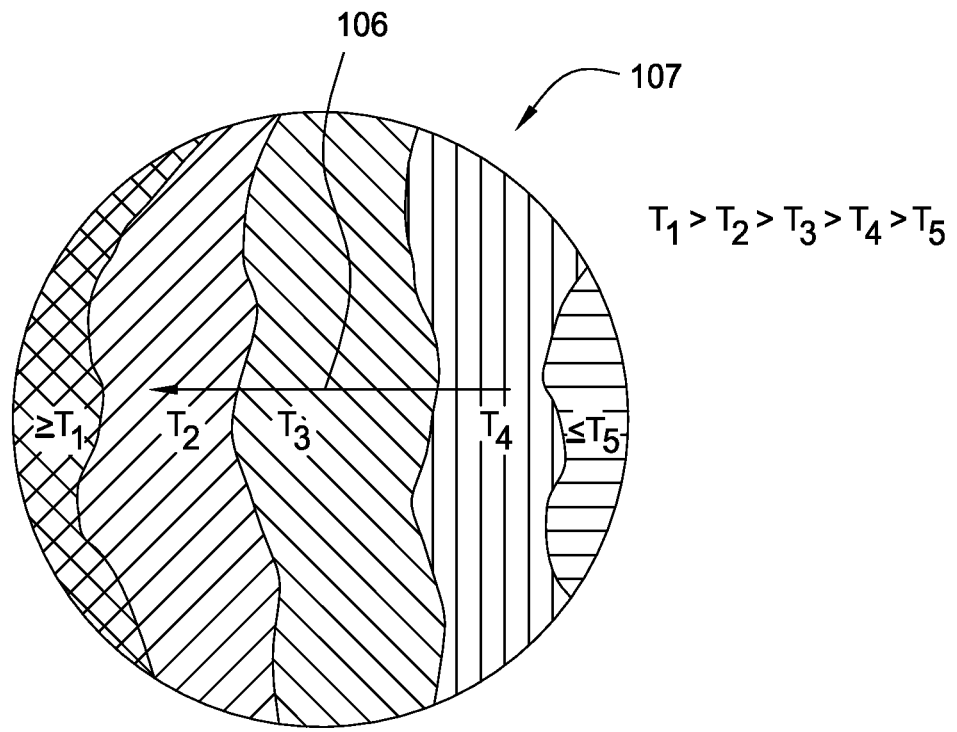
FIG. 1C is a schematic temperature map of a substrate during thermal processing, the temperature map showing a temperature gradient across the substrate.
Figure 1D:
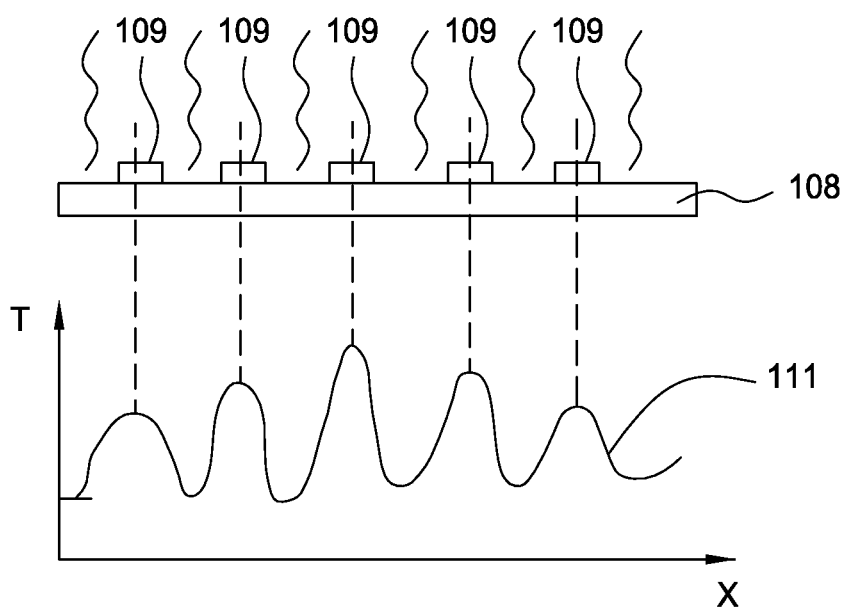
FIG. 1D is a schematic sectional side view of a patterned substrate and a temperature profile across a diameter showing variation caused by pattern.
Figure 2:
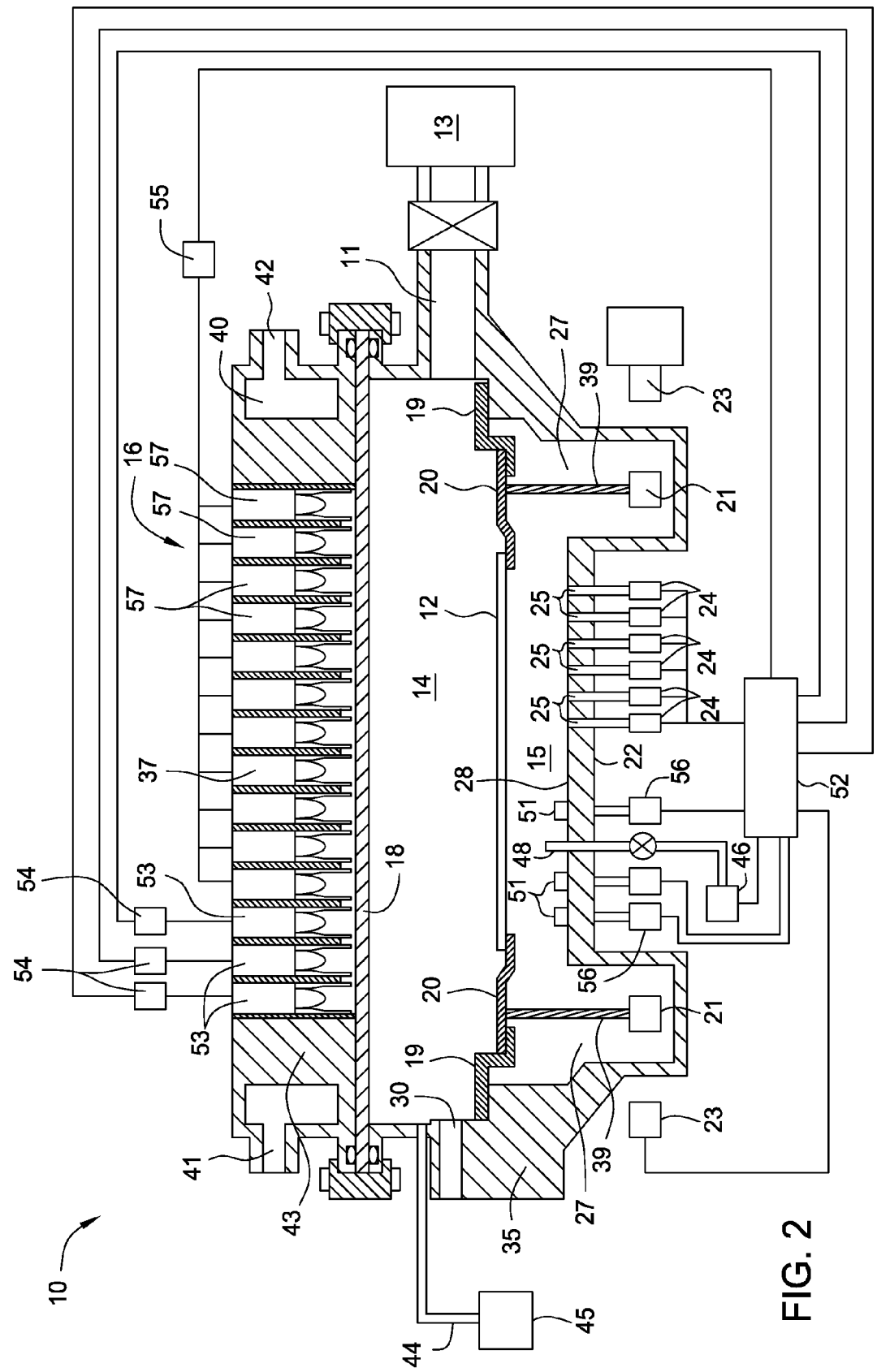
FIG. 2 is a schematic sectional side view of a thermal processing chamber in accordance with one embodiment of the present invention.

FIG. 2 schematically illustrates a sectional view of a rapid thermal processing system 10 in accordance with one embodiment of the present invention. The rapid thermal processing system 10 comprises a chamber body 35 defining a processing volume 14 configured for annealing a disk-shaped substrate 12 therein. The chamber body 35 may be made of stainless steel and may be lined with quartz. The processing volume 14 is configured to be radiantly heated by a heating lamp assembly 16 disposed on a quartz window 18 of the rapid thermal processing system 10. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 13 may be fluidly connected to the processing volume 14 through an outlet 11 for pumping out the processing volume 14.

A circular channel 27 is formed near the bottom of the chamber body 35. A magnetic rotor 21 is disposed in the circular channel 27. A tubular riser 39 rests on or otherwise coupled to the magnetic rotor 21. The substrate 12 is supported by a peripheral edge by an edge ring 20 disposed on the tubular riser 39. A magnetic stator 23 is located externally of the magnetic rotor 21 and is magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed.

The chamber body 35 may include a reflector plate 22 near the back side of the substrate 12. The reflector plate 22 has an optical reflective surface 28 facing the back side of the substrate 12 to enhance the emissivity of the substrate 12. In one embodiment, the reflector plate 22 may be water cooled. The reflective surface 28 and the back side of the substrate 12 define a reflective cavity 15. In one embodiment, the reflector plate 22 has a diameter slightly larger than the diameter of the substrate 12 being processed. For example, if the rapid thermal processing system 10 is configured to process 12 inch substrates, the diameter of the reflector plate 22 may be about 13 inches.

A purge gas may be provided to the reflector plate 22 through a purge gas inlet 48 connected to a purge gas source 46. The purge gas ejected to the reflector plate 22 helps cooling of the reflector plate 22 especially near the apertures 25 where heat is not reflected back to the substrate 12.

In one embodiment, an outer ring 19 may be coupled between the chamber body 35 and the edge ring 20 to separate the reflective cavity 15 from the processing volume 14. The reflective cavity 15 and the processing volume 14 may have different environments.

The heating lamp assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in vertical holes formed in a reflector body 43. In one embodiment, the heating elements 37 may be arranged in a hexagon pattern. A cooling channel 40 may be formed in the reflector body 43. A coolant, such as water, may enter the reflector body 43 from an inlet 41, travel adjacent the vertical holes cooling the array of heating elements 37, and exit the reflector body 43 from an exit 42.

The array of heating elements 37 are connected to a controller 52 which are capable of adjusting heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12.

In one embodiment, the heating lamp assembly 16 comprises one or more zoned groups 57 and one or more of pulse groups 53. Each of the zone groups 57 is connected to a power source 55 and may be individually controlled. In one embodiment, the amplitude of power provided to each zone groups 57 may be independently controlled to adjust radiant energy directing to a corresponding zone. Each of the pulse groups 53 comprise one or more heating elements 37 and connected to a power source 54 which may be controlled by phase and/or amplitude. The phase of the power source 54 may be adjusted to control radiant energy directed towards a section of a radial zone.

Figure 4:
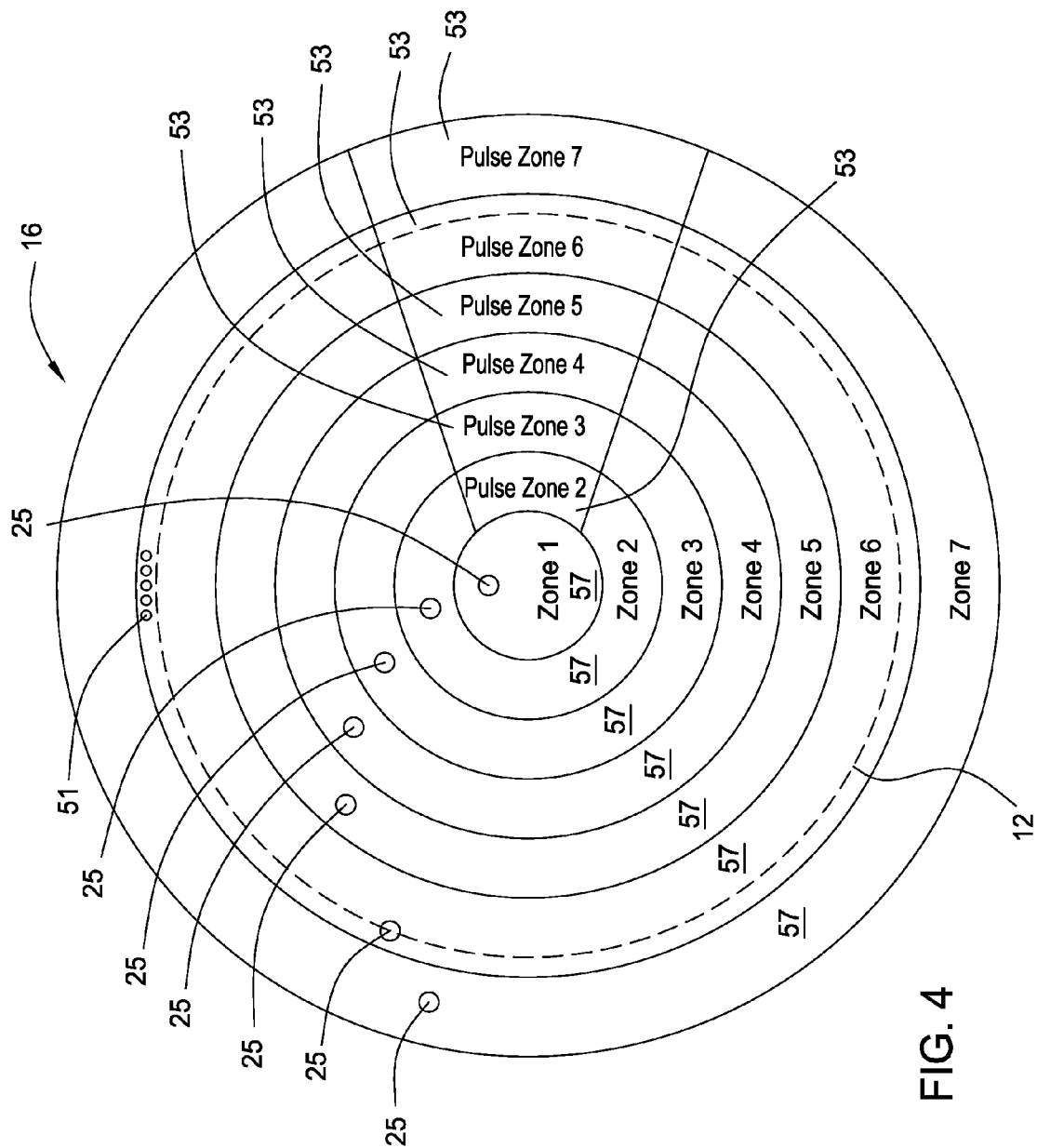
FIG. 4 is a schematic drawing showing a heating source having pulsed zones and pulsed heating components in accordance with one embodiment of the present invention.

FIG. 4 is a schematic drawing showing one embodiment of grouping the heating lamp assembly 16 of FIG. 2. Heating elements of the heating lamp assembly 16 are grouped into a plurality of zone groups 57, which are concentric to one another. Each zone group 57 comprises a plurality of heating elements. One or more pulse groups 53 are also formed in the heating lamp assembly 16.

Each of the pulse groups 53 may comprise one or more heating elements. In one embodiment, the pulse groups 53 may be formed corresponding to different radial locations. In the embodiment of FIG. 4, each pulse group 53 has a corresponding zone group 57 of the same radial coverage.

In one embodiment, heating elements in the pulse group 53 can be powered at different phase from the heating elements in the corresponding zone group 57, thus, capable of adjusting total radiant energy directed to different locations of the radial coverage as the substrate being processed is rotating.

In another embodiment, the heating elements in zone group 57 provide constant energy level towards an entire radius region of a rotating substrate while the energy level of heating elements in the pulse group 53 is pulsed and various towards areas in a radius region of a rotating substrate. But adjusting phase and amplitude of the energy level pulse of the pulse group 53, non-uniformity within a radius region of a rotating substrate can be adjusted.

The pulse groups 53 may be formed along the same radius and aligned to form a section of a circle as shown in FIG. 4. The pulse groups 53 may also be scattered at different azimuthal angles for more flexible control.

Referring back to FIG. 2, the power source 55 and the powers sources 54 are connected to the controller 52, which may obtain a substrate temperature map in-situ and adjusting the powers sources 55, 56 according to the obtained temperature map.

The rapid thermal processing system 10 further comprise a plurality of thermal probes 24 configured to measure thermal properties of the substrate 12 at different radial locations. In one embodiment, the plurality of thermal probes 24 may be a plurality of pyrometers optically coupled to and disposed in a plurality of apertures 25 formed in the reflector plate 22 to detect a temperature or other thermal properties of a different radial portion of the substrate 12. The plurality of apertures 25 may be positioned along one radius as shown in FIG. 2, or at different radius as illustrated in FIG. 4.

The plurality of probes 24 may be used to obtain a temperature map of the substrate 12 during processing when sampling at a specific frequency so that the each probe 24 can measure different locations of the substrate 12 at different times at the substrate 12 is rotating. In one embodiment, the specific frequency may be frequency higher than the frequency of the substrate rotation by multiple times, so that each probe 24 can measure locations evenly distributed along a circle when the substrate 12 rotates a whole circle.

Figure 3:
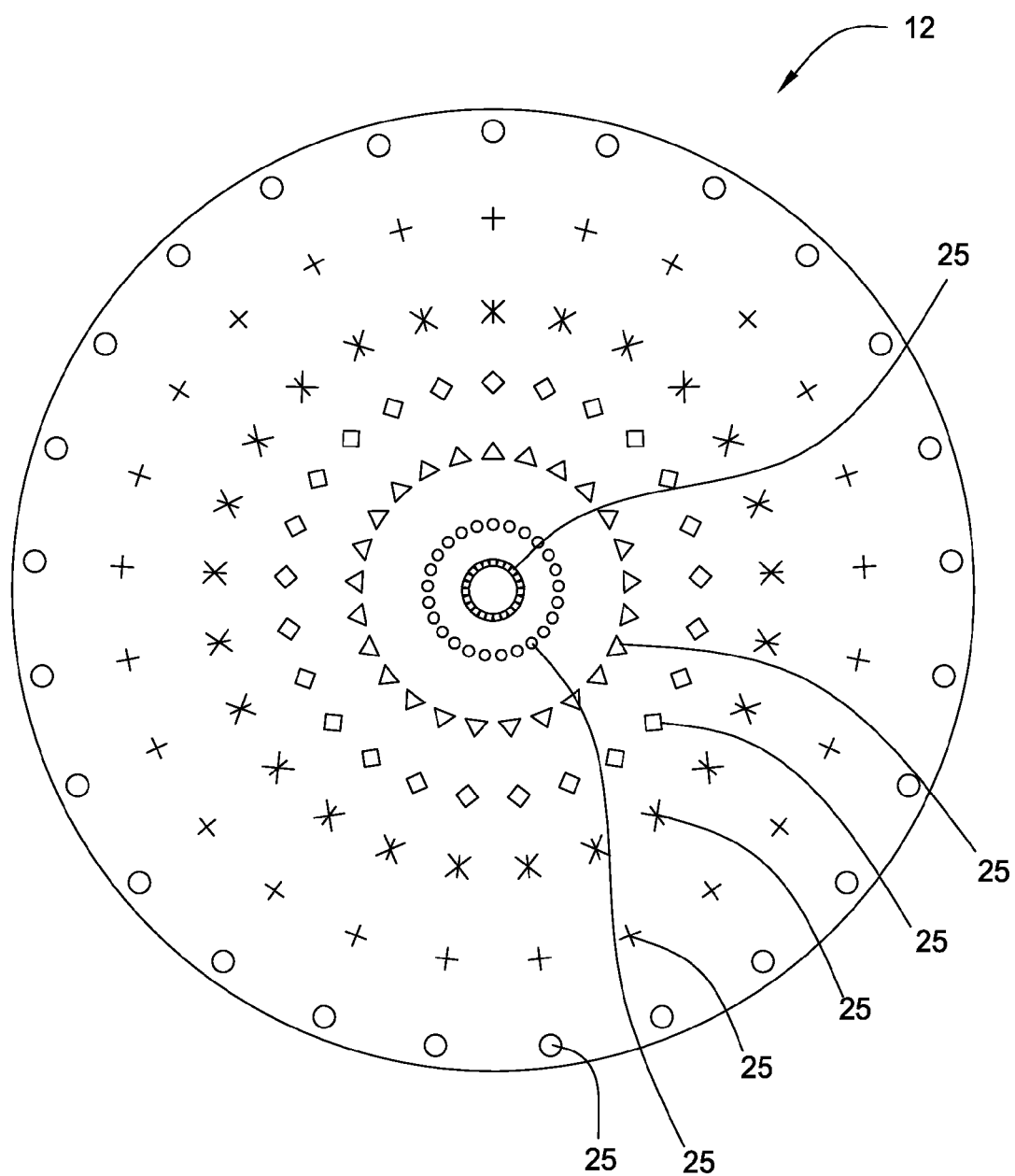
FIG. 3 is a schematic top view of a substrate illustrating a method to obtain a temperature map in accordance with one embodiment of the present invention.
Figure 5:
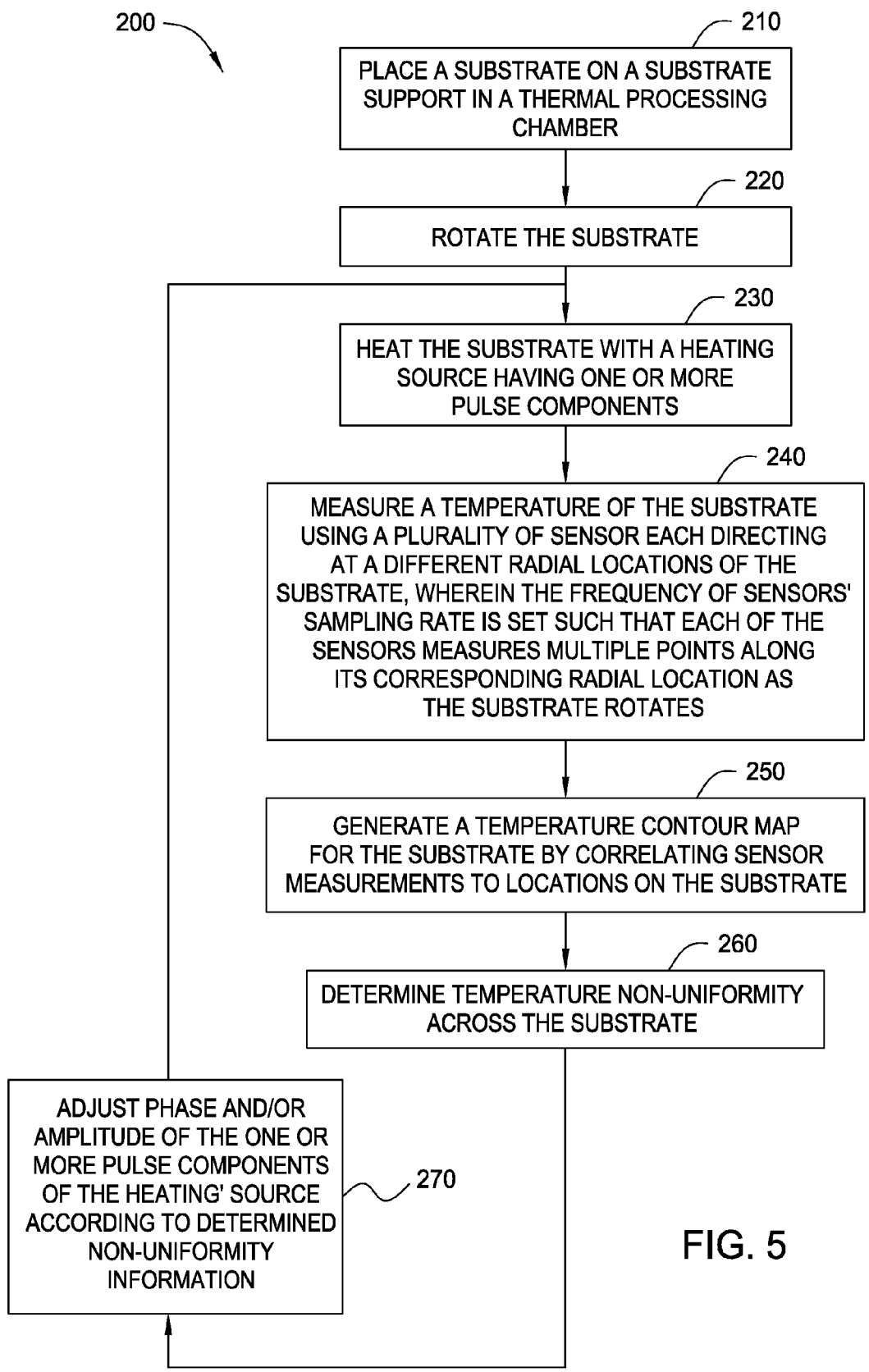
FIG. 5 is a schematic flow chart illustrating a method for processing a substrate in accordance with one embodiment of the present invention.

FIG. 3 is a schematic top view of a substrate illustrating a method to obtain a temperature map in accordance with one embodiment of the present invention. FIG. 5 is an exemplary map of the substrate 12 showing locations on the substrate at which temperature data is obtained when the substrate rotates at 4 Hz and the data sampling is at 100 Hz. A temperature map across the substrate 12 may be obtained.

Referring back to FIG. 2, the thermal processing system 10 may also comprise one or more auxiliary heating sources 51 configured to heat the substrate 12 during processing. Similar to the pulse groups 53, the auxiliary heating sources 51 are connected to power sources 56 which may be controlled by adjusting phase and/or amplitude. The auxiliary heating source 51 is configured to reduce temperature non-uniformity by imposing more radiant energy towards locations have lower temperature than location have higher temperatures along a corresponding circular region.

In one embodiment, the auxiliary heating source 51 may be positioned on an opposite side of the heating lamp assembly 16. Each of the auxiliary heating source 51 and the pulse groups 53 may be used independently or in combination.

In one embodiment, the auxiliary heating source 51 may be a radiation source which produces no radiation in the bandwidth of the probes 24. In another embodiment, the apertures 25 may be shielded from the auxiliary heating source so that the probes 24 are not affected by the radiation from the auxiliary heating source 51. In one embodiment, the auxiliary heating source 51 may be lasers (such as diode lasers, ruby lasers, CO2 lasers, or others) diodes, or line emitters. In one embodiment, the auxiliary heating source 51 may be disposed outside the process chamber and energy from the auxiliary heating source 51 may be directed to the processing volume via fibre optics, a light pipe, mirror, or a total internal reflecting prism.

FIG. 5 is a schematic flow chart illustrating a method 200 for processing a substrate in accordance with one embodiment of the present invention. The method 200 is configured to reduce non-uniformities including radial non-uniformity and non-radial non-uniformity. In one embodiment, the method 200 may be performed using thermal processing systems in accordance with embodiments of the present invention.

In box 210, a substrate being processed may be placed in a thermal processing chamber, such as the thermal processing system 10 of FIG. 2. In one embodiment, placing the substrate may be performed by a robot on an edge ring.

In box 220, the substrate is rotated within the thermal processing chamber.

In box 230, the substrate is heated by a heating source having one or more pulse components which can be adjusted by one of phase or amplitude. Exemplary pulse components may be the auxiliary heating source 51 and the pulse group 53 of FIG. 2.

In box 240, a temperature of the substrate may be measured using a plurality of sensors, such as the probes 24 of thermal processing system 10. As the substrate rotates, a plurality of locations may be measured by using a specific sampling rate.

In box 250, a temperature map of the substrate may be generated from the measurement of box 240. In one embodiment, the temperature map may generated by software in a controller, such as the controller 52 of FIG. 2.

In box 260, characteristics of temperature non-uniformities may be determined from the temperature map obtained in box 250. The characteristics may be overall variations, variations among zones correspondence to heating zones, variations within a heating zone, such as angles with high and low temperatures, etc.

In box 270, phase and/or amplitude of the one or more pulse components may be adjusted to reduce temperature variations. Detailed adjustment is described in FIGS. 6A-6E and FIGS. 7A-7E below.

The boxes 230, 240, 250, 260 and 270 may be performed repeatedly until the processing is complete.

Figure 6A:
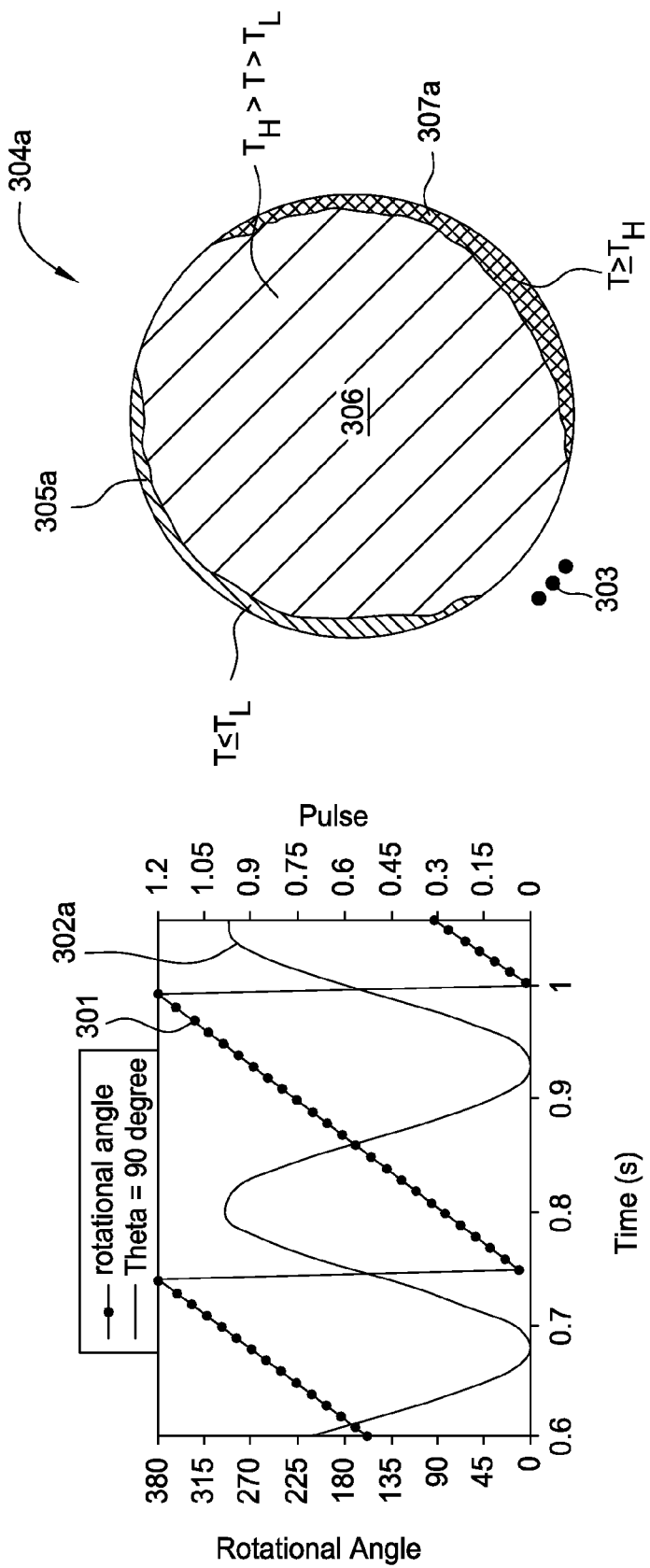
FIG. 6A is a schematic plot showing an effect of a pulsed laser heating source at one phase.

FIG. 6A is a schematic plot showing an effect of a pulsed laser heating source 303 configured to direct radiant energy towards an edge region of a substrate 304*a*. The substrate 304*a* is heated by a main heating source, such as the heating lamp assembly 16 of FIG. 2, and the pulsed laser heating source 303. The heating source 303 may be similar to the auxiliary heating source 51 of FIG. 2. Line 301 illustrates a rotation angle of the substrate 304*a* relative to the heating source 303. Curve 302*a* illustrates power supplied to the heating source 303.

The power supplied to the heating source 303 has the same frequency as rotation frequency of the substrate 304a. Therefore, as the substrate rotates, the highest power level is repeatedly directed toward a location 307a which is about 90 degrees from the heating source 303 before rotating begins. Similarly, the lowest power level is repeatedly directed at a location 305a which is 270 degrees from the heating source 303.

As a result, the power supplied to the heating source 303 may be adjusted so that its peak strikes when a low temperature location passes the heating source 303 to provide additional heating to the low temperature location.

Even though, the power supplied to the heating source 303 is illustrated as sinusoidal pulses here, any suitable pulses may be applied.

Additionally, the frequency of the power supplied to the heating source 303 may be different from the rotation frequency. For example, the power frequency may be a fraction of the rotation frequency, such as a half, a third, or a fourth, to achieve desired purposes.

Figure 6B:
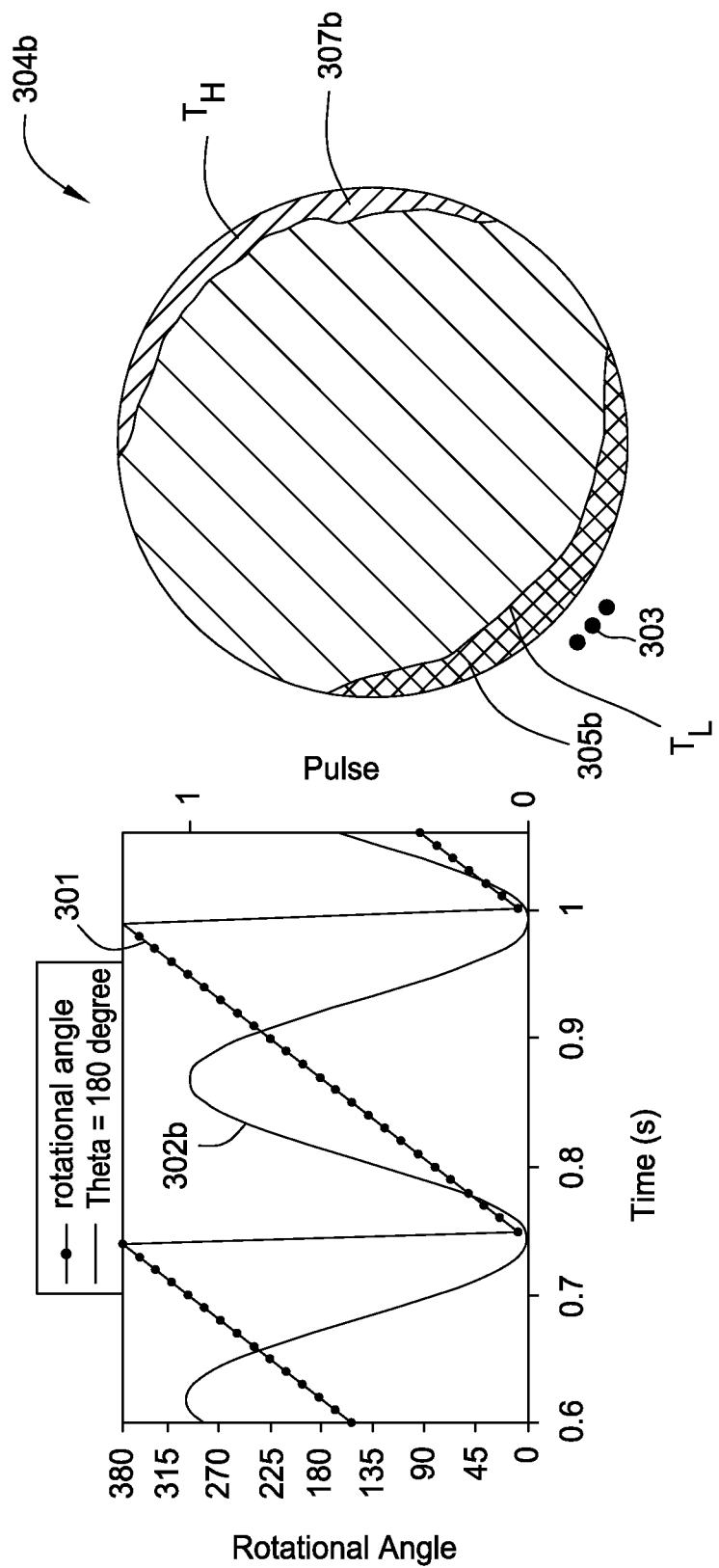
FIG. 6B is a schematic plot showing an effect of a pulsed laser heating source at one phase.

FIG. 6B is a schematic plot showing an effect of the pulsed laser heating source 303 configured to direct radiant energy towards the substrate 304b at when the heating source is powered at a power 302b. The highest power level is repeatedly directed toward a location 307b which is about 180 degrees from the heating source 303 before rotating begins. Similarly, the lowest power level is repeatedly directed at a location 305b which is 0 degrees from the heating source 303.

Figure 6C:
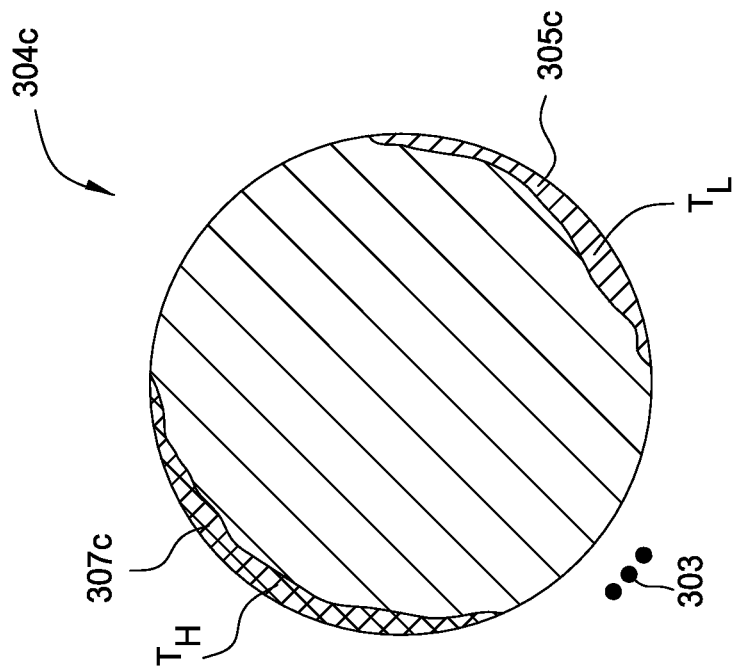
FIG. 6C is a schematic plot showing an effect of a pulsed laser heating source at one phase.
Figure 6C:
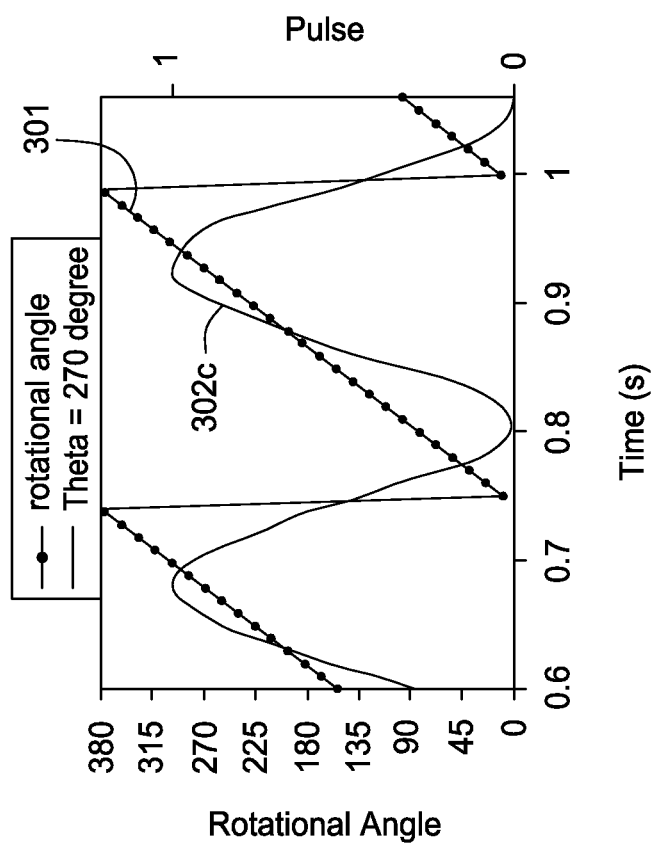

FIG. 6C is a schematic plot showing an effect of the pulsed laser heating source 303 configured to direct radiant energy towards the substrate 304c at when the heating source is powered at a power 302c. The highest power level is repeatedly directed toward a location 307c which is about 270 degrees from the heating source 303 before rotating begins. Similarly, the lowest power level is repeatedly directed at a location 305c which is 90 degrees from the heating source 303.

Figure 6D:
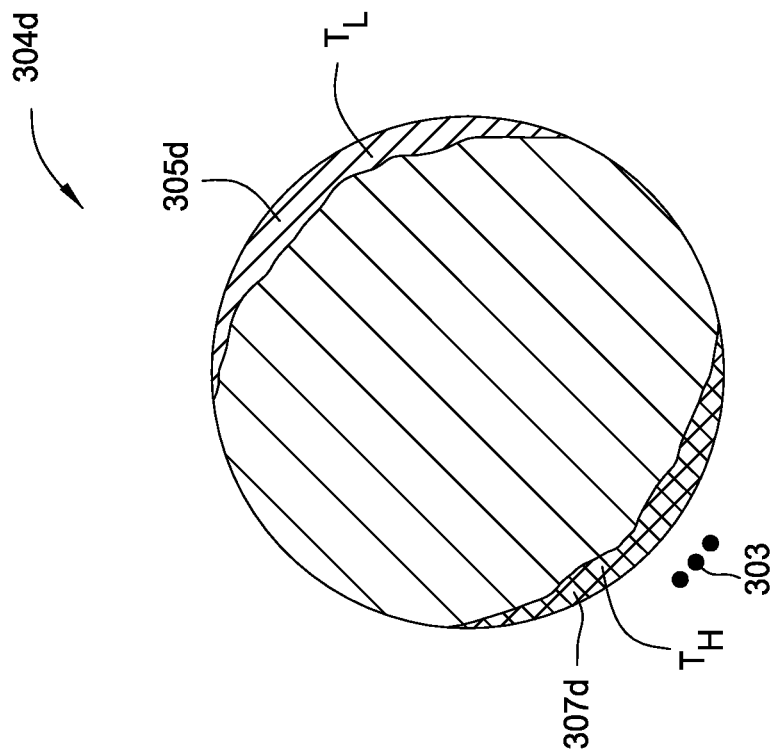
FIG. 6D is a schematic plot showing an effect of a pulsed laser heating source at one phase.
Figure 6D:
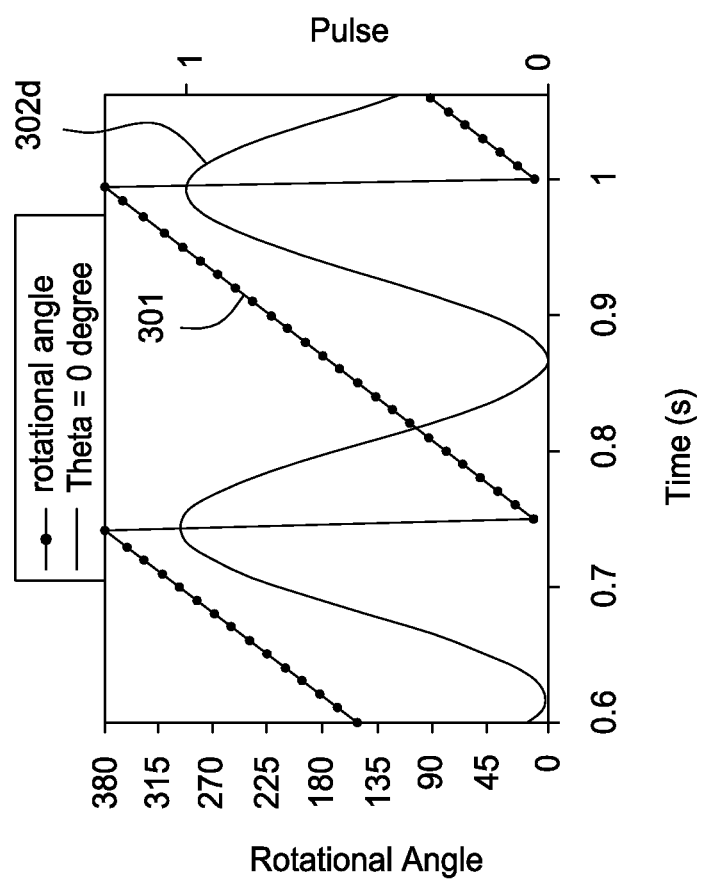

FIG. 6D is a schematic plot showing an effect of the pulsed laser heating source 303 configured to direct radiant energy towards the substrate 304d at when the heating source is powered at a power 302d. The highest power level is repeatedly directed toward a location 307d which is about 0 degrees from the heating source 303 before rotating begins. Similarly, the lowest power level is repeatedly directed at a location 305d which is 180 degrees from the heating source 303.

FIGS. 6E-6F schematically illustrate uniformity improvement by adjusting phase and amplitude of a laser heating source. As shown in FIG. 6E, there is a non-radial non-uniformity along an edge of the substrate being processed without adjusting phase and amplitude of the laser heating source. FIG. 6F schematically shows a temperature map of a substrate being processed with phase and amplitude adjustment. The non-radial non-uniformity is substantially reduced by adjusting phase of a laser heating source.

Figure 7A:
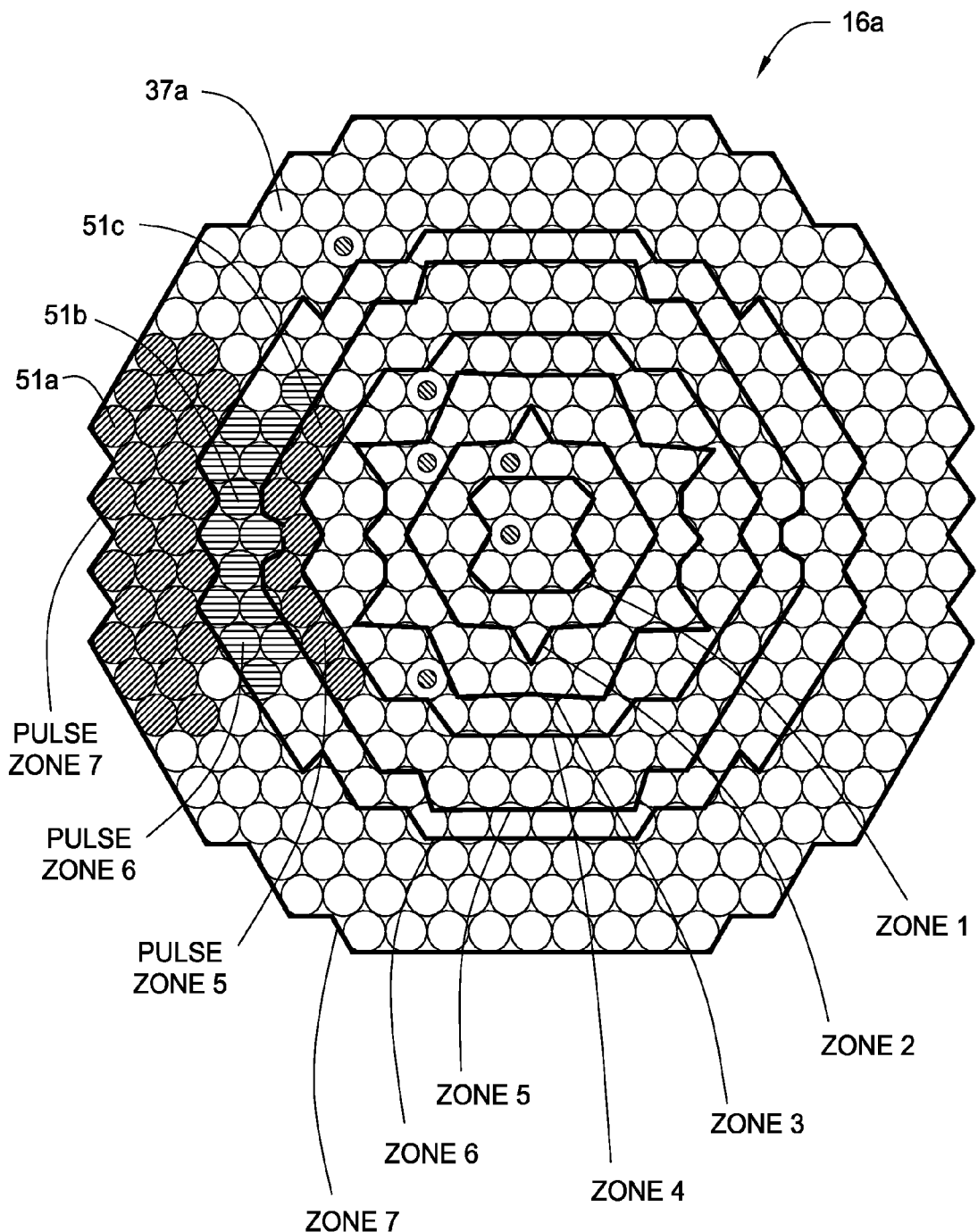
FIG. 7A is a schematic top view of a lamp assembly having three pulsed zones.

FIG. 7A is a schematic top view of a heating lamp assembly 16a having three pulsed zones 51a, 51b, 51c. The pulsed zone 51a comprises a plurality of heating elements 37a disposed on a region corresponding to a region outside an edge of the substrate. The heating elements in each pulsed zone 51a, 51b, 51c may be independently controlled from other heating elements in the heating lamp assembly 16a by adjusting phase and amplitude of the corresponding power source. The pulsed zone 51b comprises a plurality of heating elements 37a disposed in a region corresponding to a region near the edge of the substrate. The pulsed zone 51c comprises a plurality of heating elements disposed in a region corresponding to region near a middle section of the substrate. The lamp assemblies 16a may be used in the thermal processing system 10 of FIG. 2.

Figure 7B:
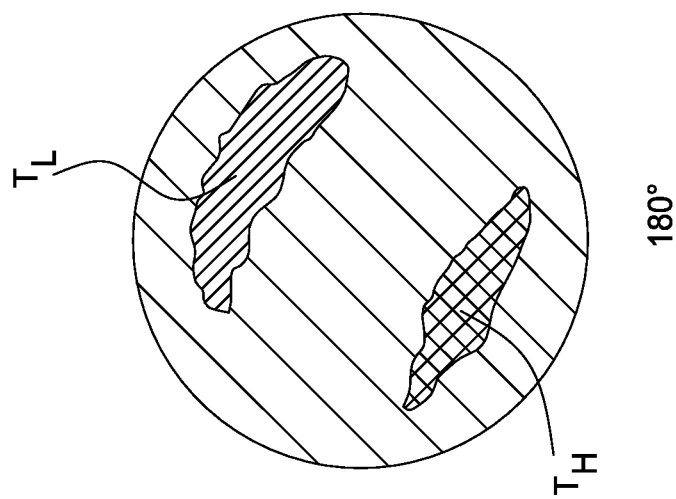
FIG. 7B schematically illustrates effects of a pulsed lamp zone near corresponding to a middle region of a substrate.
Figure 7B:
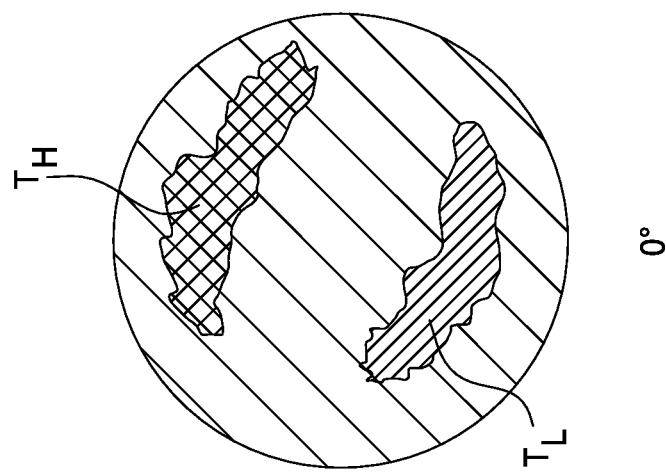

FIG. 7B schematically illustrates effects of a pulsed zone 51c. As illustrated in FIG. 7B, adjusting phase of the pulsed zone 51c can change temperature variations within the middle region of the substrate.

Figure 7C:
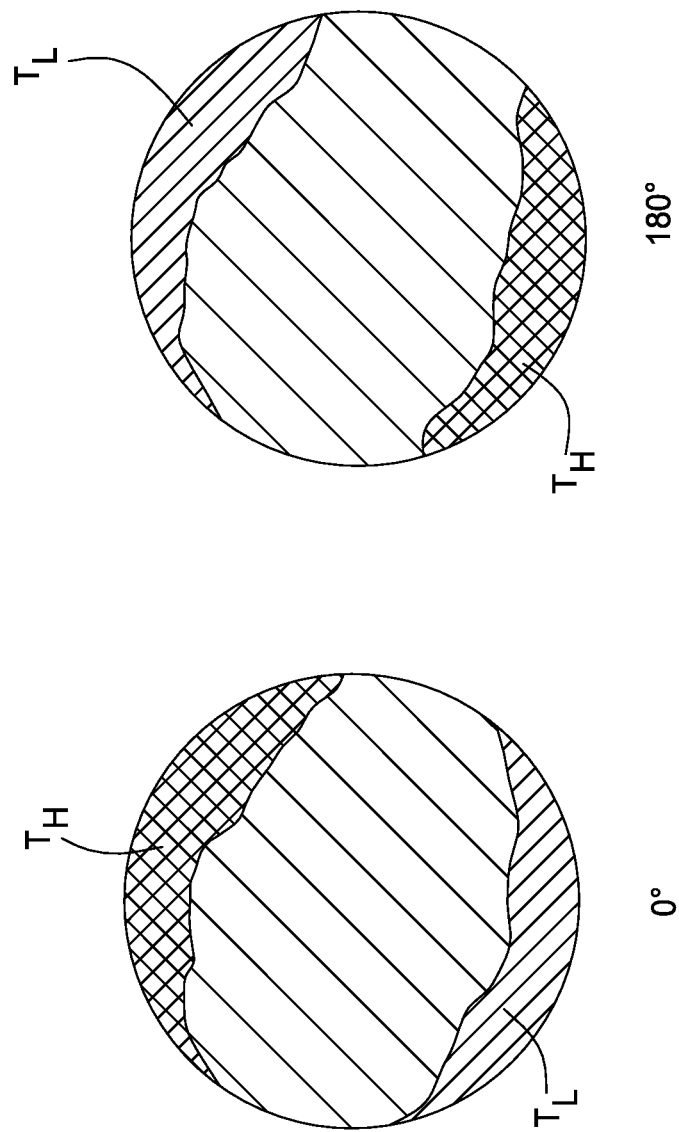
FIG. 7C schematically illustrates effects of a pulsed lamp zone near corresponding to edge region of a substrate.

FIG. 7C schematically illustrates effects of a pulsed zone 51b. As illustrated in FIG. 7C, adjusting phase of the pulsed zone 51b can change temperature variations within an edge region of the substrate.

Figure 7D:
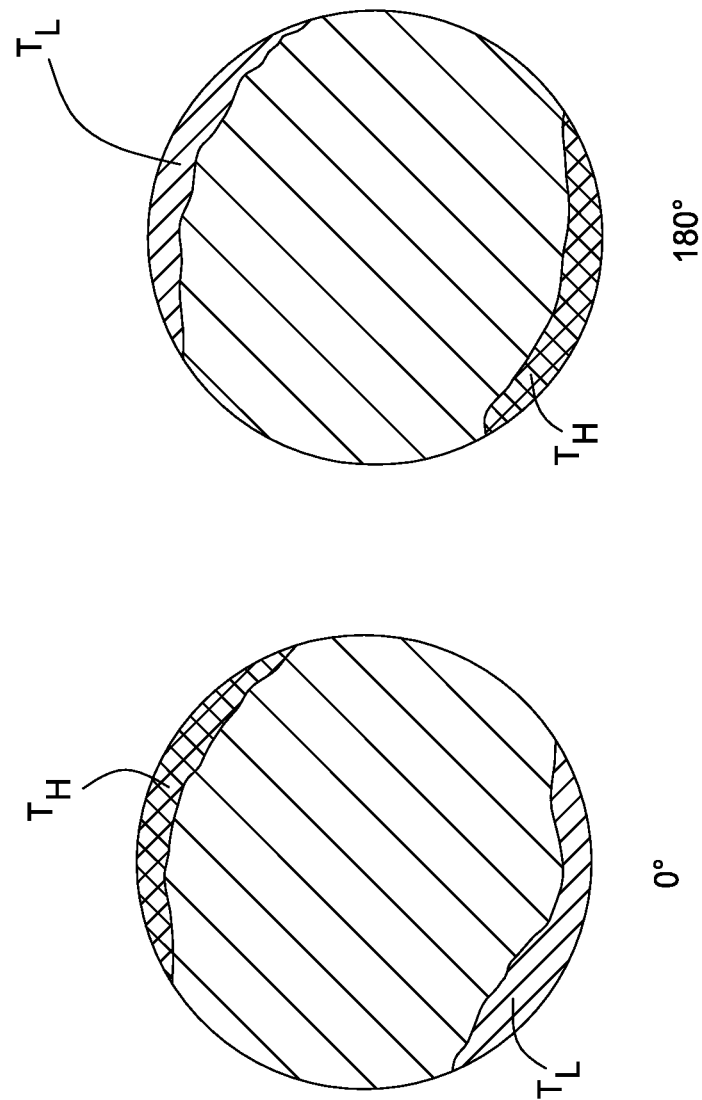
FIG. 7D schematically illustrates effects of a pulsed lamp zone near corresponding to a region outwards an edge of the substrate.

FIG. 7D schematically illustrates effects of a pulsed zone 51a. As illustrated in FIG. 7D, adjusting phase of the pulsed zone 51a can change temperature variations within the bevel edge region of the substrate.

Figure 7E:
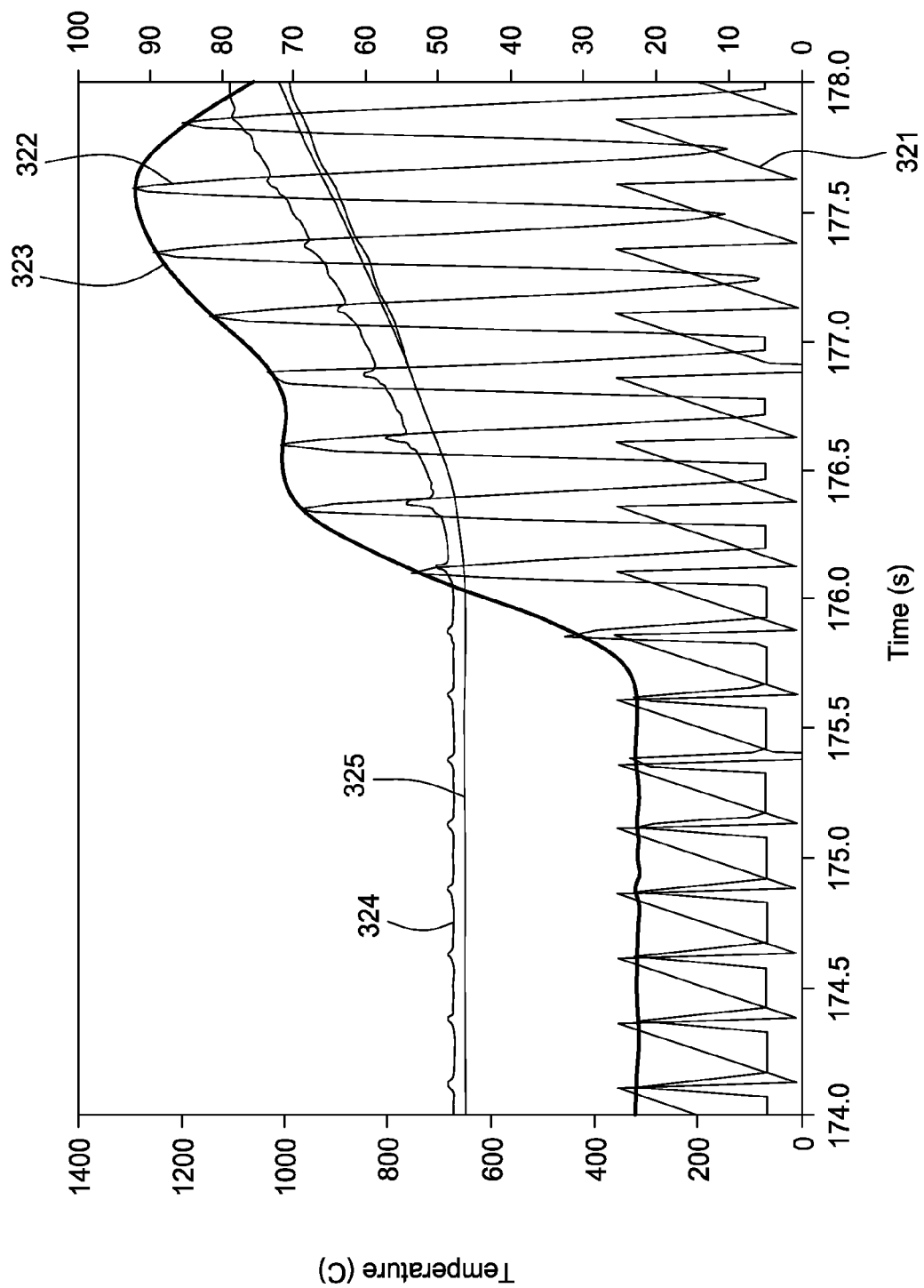
FIG. 7E is a schematic plot showing a thermal process that adjusts phase and amplitude of lamps in a pulsed zone corresponding to a region outwards an edge of a substrate.

FIG. 7E is a schematic plot showing a thermal process that adjusts phase and amplitude of the pulsed zone 51a of FIG. 7A. During the process the substrate is rotating at a frequency of 4 Hz. The temperature is measured at a sampling frequency of 100 Hz with 7 pyrometers corresponding substrate center to the edge. The thermal processing resembles a spike anneal, which high ramping up and ramping down rates.

Curve 321 reflects rotation cycle of the substrate. Curve 322 reflects phase and amplitude of power supplied to the pulsed zone 51a. Curve 323 reflects power supplied to heating elements 37a that are not in the pulsed zones 51a. Curves 325 indicate temperatures measured by different sensors at different locations. Curve 324 indicates temperatures of an edge ring supporting the substrate during process.

The amplitude of pulsed power is synchronized with the main power. This configuration allows the main heating assembly and the pulsed zone to use the same power supply.

Figure 8:
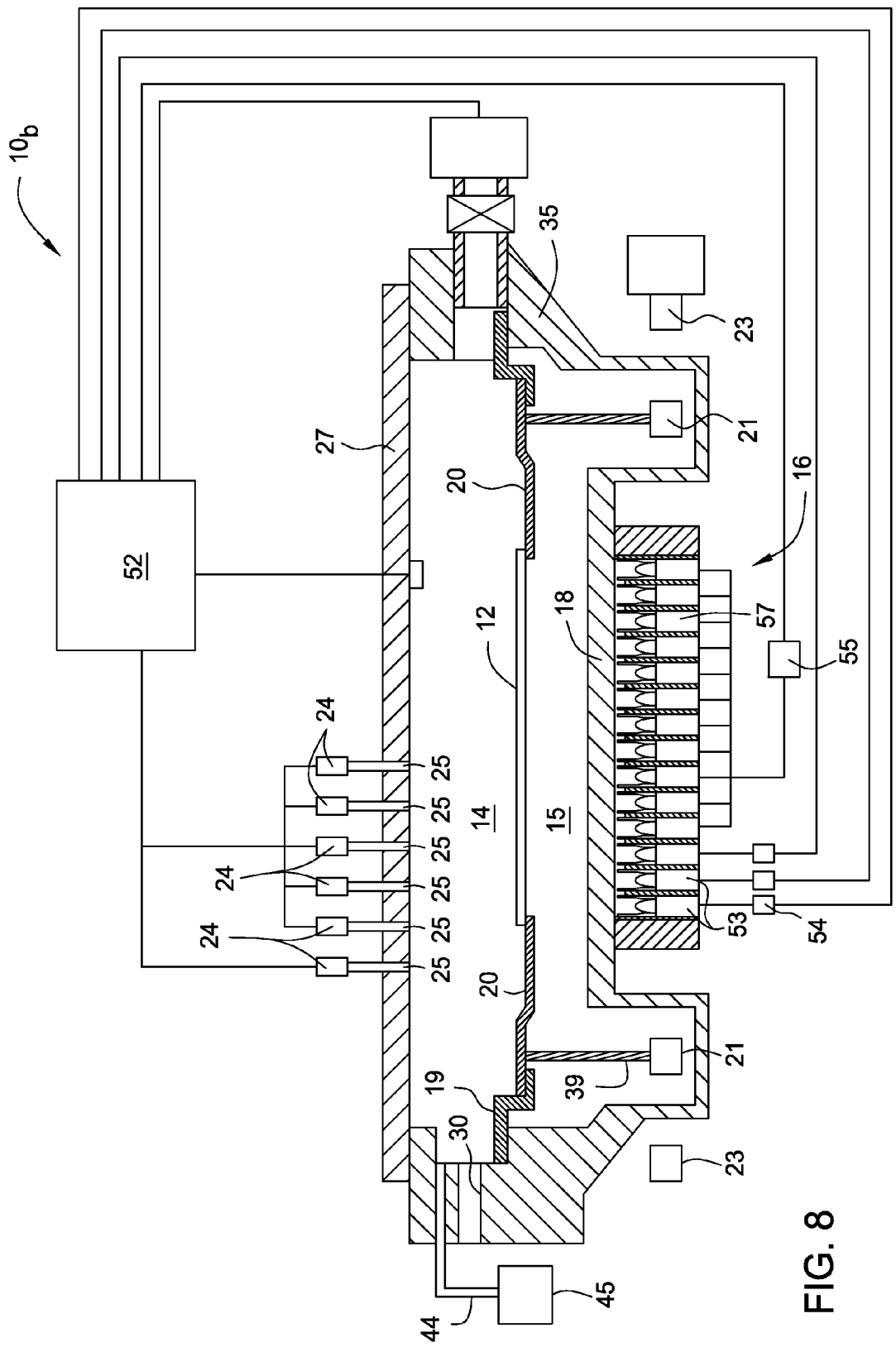
FIG. 8 is a schematic sectional side view of a thermal processing chamber in accordance with one embodiment of the present invention.

FIG. 8 is a schematic sectional side view of a thermal processing system $10_b$ in accordance with one embodiment of the present invention. The thermal processing system $10_b$ is similar to the thermal processing system 10 except that heating lamp assembly 16 is positioned on a bottom side of the chamber body 35 while the reflector plate 27 is positioned on the top of the chamber.

The arrangement of the thermal processing system $10_b$ allows the substrate to be heated by the heating lamp assembly 16 from the back side. The substrate 12 needs to face up to expose the patterned side to processing gases delivered to the processing volume 14. The back side heating using the thermal processing system $10_b$ reduced temperature variations due to pattern on the device side. FIGS. 10A-10D illustrate the advantage of backside heating.

Figure 10B:
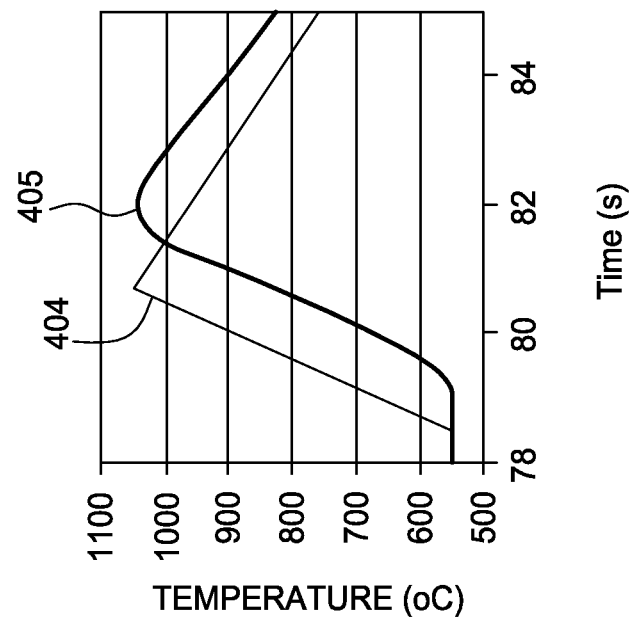
FIG. 10B is a schematic plot showing a thermal process performed to the test substrate of FIG. 10A.
Figure 10A:
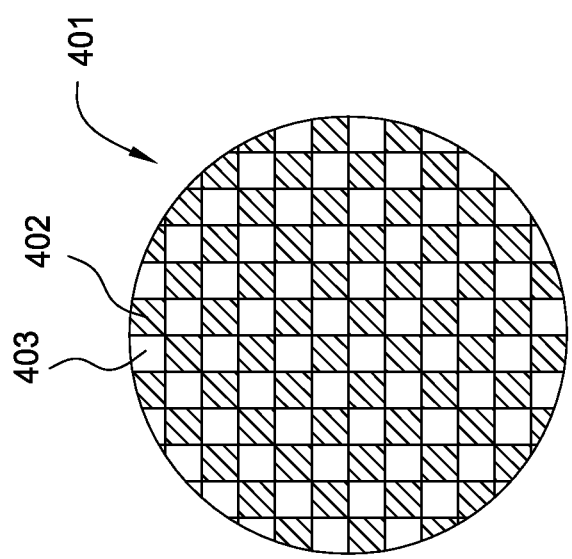
FIG. 10A is a schematic top view of a test substrate having a checker board pattern.

FIG. 10A is a schematic top view of a test substrate 401 having a checker board pattern. Blocks 402 are covered by 1700 angstroms of silicon oxide. Blocks 403 are covered by 570 angstroms of polycrystalline silicon.

FIG. 10B is a schematic plot showing a thermal process performed to the test substrate of FIG. 10A. Line 404 illustrates an average temperature of the heating elements. Line 405 illustrates an average temperature of the substrate. Oxygen is flown during the thermal processing so that silicon oxide is formed on backside of the substrate. The thickness of the silicon oxide generated on the backside of the substrate reflects the temperature of the substrate.

Figure 10D:
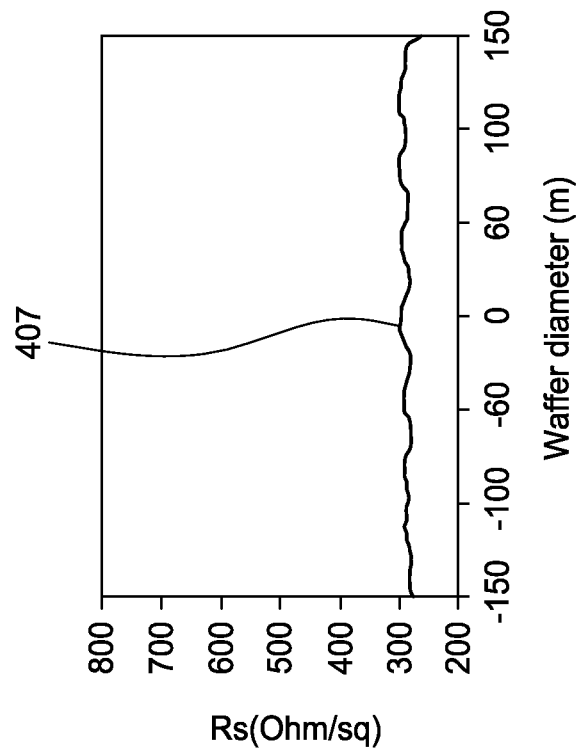
FIG. 10D is a schematic plot showing a temperature profile across a diameter of the test substrate during thermal processing by heating the non-patterned side of the substrate.
Figure 10C:
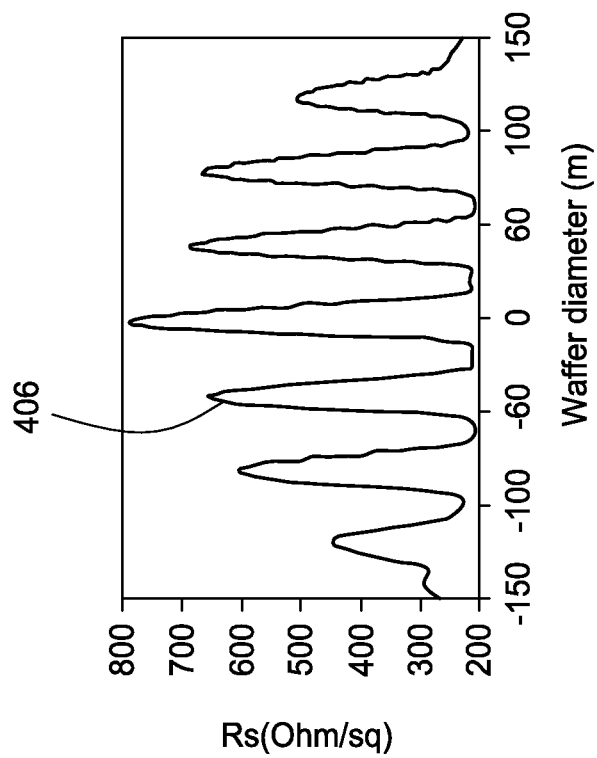
FIG. 10C is a schematic plot showing a temperature profile across a diameter of the test substrate during thermal processing by heating the patterned side of the substrate.

FIG. 10C is a schematic plot of a curve 406 showing thickness of backside silicon oxide of the test substrate when the test substrate is heated from the patterned side. The variation of silicon oxide thickness reflects the variation of substrate temperature. The variation of temperature is strongly effect by the pattern.

FIG. 10D is a schematic plot of a curve 407 showing silicon oxide thickness across a diameter of the test substrate during thermal processing by heating the non-patterned side of the substrate, for example using a thermal processing system similar to the thermal processing system $10_b$ of FIG. 8.

Temperature control methods in accordance with embodiments of the present invention can also be extended to control temperatures of an edge ring configured to support a substrate during processing.

Figure 9:
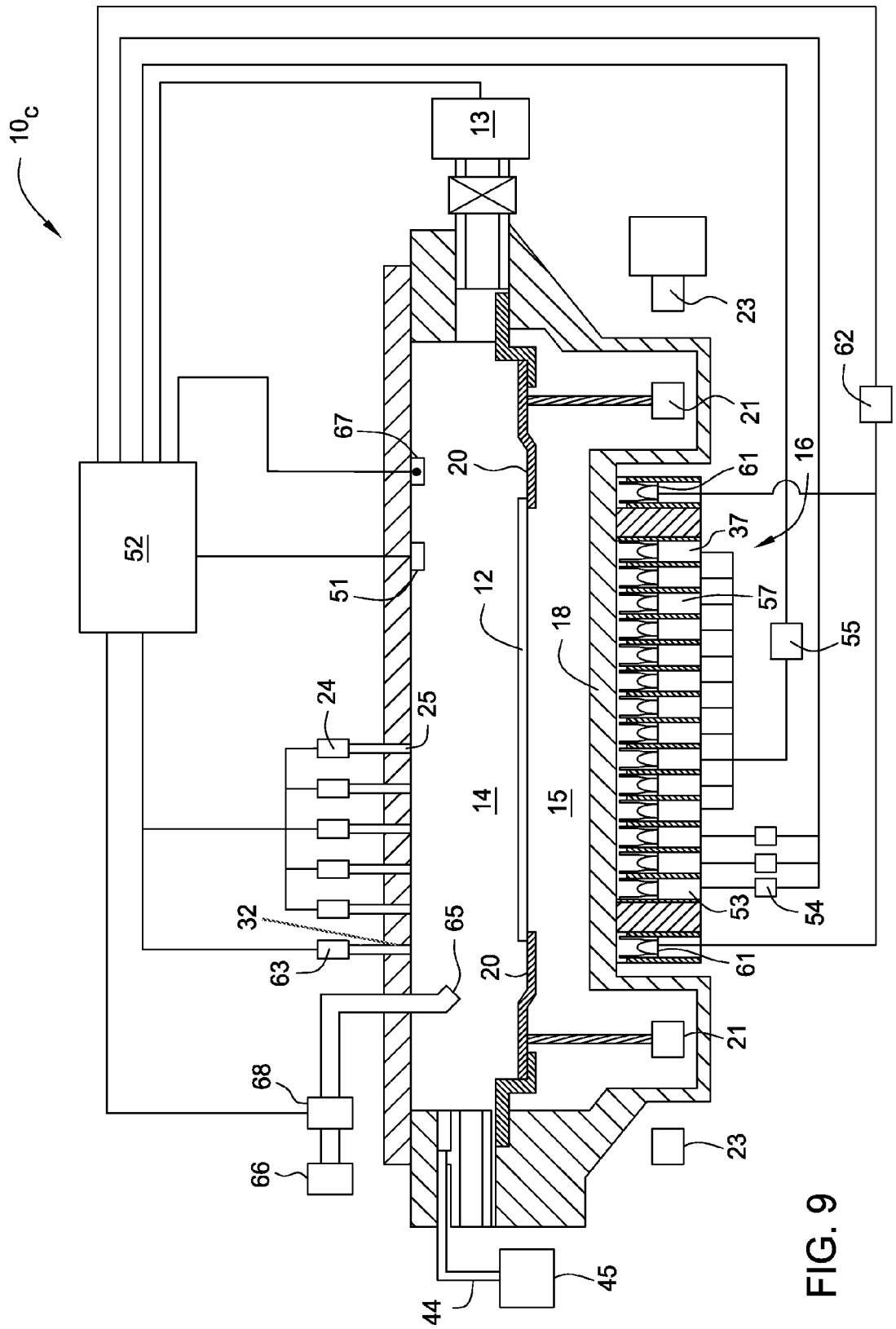
FIG. 9 is a schematic sectional side view of a thermal processing chamber in accordance with one embodiment of the present invention.

FIG. 9 is a schematic sectional side view of a thermal processing chamber 10c in accordance with one embodiment of the present invention. The thermal processing chamber 10c is similar to the thermal processing system $10_b$ except that the thermal processing system 10c further comprises sensors, heating and cooling assemblies for the edge ring 20.

The edge ring 20 may be designed to have thermal properties, such as thermal mass, emissivity and absorptivity, according to the thermal properties of the substrate 12 being processed to improve substrate temperature profile. The thermal properties of the edge ring 20 may be altered by choosing different materials, different thicknesses and different coatings.

In one embodiment, an edge ring heating assembly 61 configured primarily to heat the edge ring 20 may be disposed outside the array of heating elements 37 of the heating lamp assembly 16. The edge ring heating assembly 61 is connected to the controller 52 which may adjust a heating power 62 of the edge ring heating assembly 61. The edge ring heating assembly 61 is independently controllable from the array of heating elements 37, hence controlling the temperature of the edge ring 20 independently from the temperature of the substrate 12.

The thermal processing system 10c further comprises an edge ring thermal probe 63 coupled to and disposed in an aperture 32 on the reflector plate 22 near the edge ring 20. The edge ring thermal probe 63 may be a pyrometer configured to measure a temperature or other thermal properties of the edge ring 20. The edge ring thermal probe 63 is connected with the controller 52 which is connected to the edge ring heating assembly 61.

The thermal processing system 10c may further comprises an auxiliary heating source 67 configured to adjust non-radial temperature variations to the edge ring 20.

A gas jet 65 may be disposed near the edge ring 20 for cooling the edge ring 20. In one embodiment, the gas jet 65 may share the same purge gas source 66. The gas jet 65 may be directed to the edge ring 20 and ejecting a cooling gas, such as helium, to cool the edge ring 20. The gas jet 65 may be connected to the gas source 66 through a valve 68 which may be controlled by the controller 52. The controller 52, therefore, may include the cooling effect of the gas jet 66 in the closed looped temperature control of the edge ring 20.

The measurement from the sensor 63 may be to generate a temperature map for the edge ring 20 in a similar way as using the probes 24 to generate a temperature map for the substrate 12. Methods, such as method 200, may be used to adjust phase and/or amplitude of the edge ring heating assembly 61, and/or the auxiliary heating source 67 to reduce non-uniformity in the edge ring 20. Additionally, the flow rate of cooling gas from the gas jet 65 may be adjusted during according to the rotation angle of the edge ring 20 to allow adjustable cooling.

Even though, processing of semiconductor substrates are described in this application, embodiments of the present invention may be used in any suitable situation to control temperature of objects being heated. Embodiments of the present invention may also be applied to a cooling process in controlling cooling apparatus.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
placing a substrate on an edge ring disposed in a processing volume of a processing chamber;
rotating the substrate and the edge ring;
heating the substrate by directing radiant energy towards the substrate from a first heating source;
heating the edge ring by directing pulsed energy from a second heating source towards the edge ring;
measuring temperature of at least one of the edge ring and the substrate; and
adjusting at least one of frequency, phase and amplitude of the second heating source according to the measured temperature, wherein measuring the temperature comprises sampling a sensor directed at the substrate or the edge ring at a frequency higher than the frequency of substrate rotation by multiple times.

2. The method of claim 1, further comprising: determining temperature variations within the edge ring or the substrate from the temperature measurements, wherein adjusting at least one of the frequency, phase and amplitude of the pulse heat source according to the determined temperature variations.

3. A method for processing a substrate, comprising:
placing a substrate on an edge ring disposed in a processing volume of a processing chamber;
rotating the substrate and the edge ring;
heating the substrate by directing radiant energy towards the substrate from a first heating source;
heating the edge ring by directing pulsed energy from a second heating source towards the edge ring;
measuring temperature of at least one of the edge ring and the substrate; and
adjusting at least one of frequency, phase and amplitude of the second heating source according to the measured temperature, wherein the second heating source has the same frequency as the frequency of substrate rotation, and adjusting the second heating source comprises striking a peak power level of the second heating source toward a point with a lowest temperature within the edge ring.

* * * * *